United States Patent
Li et al.

(10) Patent No.: US 9,547,047 B2
(45) Date of Patent: Jan. 17, 2017

(54) LEAKAGE CURRENT DETECTION DEVICE WITH SELF-TESTING FUNCTION

(71) Applicant: Chengli Li, Suzhou (CN)

(72) Inventors: Chengli Li, Suzhou (CN); Guolan Yue, Suzhou (CN)

(73) Assignee: Chengli Li, Suzhou (CN)

( * ) Notice: Subject to any disclaimer, the term of this patent is extended or adjusted under 35 U.S.C. 154(b) by 114 days.

(21) Appl. No.: 14/614,334

(22) Filed: Feb. 4, 2015

(65) Prior Publication Data

US 2016/0169981 A1   Jun. 16, 2016

(30) Foreign Application Priority Data

Dec. 15, 2014 (CN) .......................... 2014 1 0778672
Dec. 15, 2014 (CN) ..................... 2014 2 0796319 U

(51) Int. Cl.
*G01R 35/00* (2006.01)
*H02H 3/33* (2006.01)
*G01R 31/42* (2006.01)

(52) U.S. Cl.
CPC .............. *G01R 31/42* (2013.01); *G01R 35/00* (2013.01); *H02H 3/335* (2013.01)

(58) Field of Classification Search
CPC ............................... G01R 35/00; H02H 3/335
USPC .......................................................... 361/42
See application file for complete search history.

(56) References Cited

U.S. PATENT DOCUMENTS

| | | | |
|---|---|---|---|
| 6,980,005 B2* | 12/2005 | Finlay, Sr. ............. | H02H 3/335 324/424 |
| 8,081,001 B2* | 12/2011 | Hooper .................. | H02H 3/335 324/424 |
| 8,513,964 B2 | 8/2013 | Yue et al. | |
| 2005/0212522 A1 | 9/2005 | Finlay et al. | |
| 2012/0217970 A1* | 8/2012 | Macbeth ............... | G01R 31/14 324/424 |
| 2014/0009856 A1 | 1/2014 | Ward et al. | |
| 2014/0268436 A1* | 9/2014 | Du ....................... | H02H 11/002 361/42 |
| 2015/0062760 A1 | 3/2015 | Simonin | |
| 2015/0309103 A1* | 10/2015 | Ostrovsky .......... | G01R 31/3277 324/509 |

* cited by examiner

*Primary Examiner* — Scott Bauer
(74) *Attorney, Agent, or Firm* — Chen Yoshimura LLP

(57) ABSTRACT

A leakage current detection device coupled to AC power supply wires carrying an AC signal, which includes: a leakage current detection circuit including a leakage current detector, the leakage current detection circuit operating during first half-cycles among positive and negative half-cycles of the AC signal to detect a leakage current of the power supply wires and to disconnect the power supply wires from an output side when a leakage current exceeding a first threshold value is detected; and a self-detecting circuit coupled to the leakage current detection circuit, operating during second half-cycles among the positive and negative half-cycles of the AC signal to test whether the leakage current detection circuit is functioning normally.

12 Claims, 4 Drawing Sheets

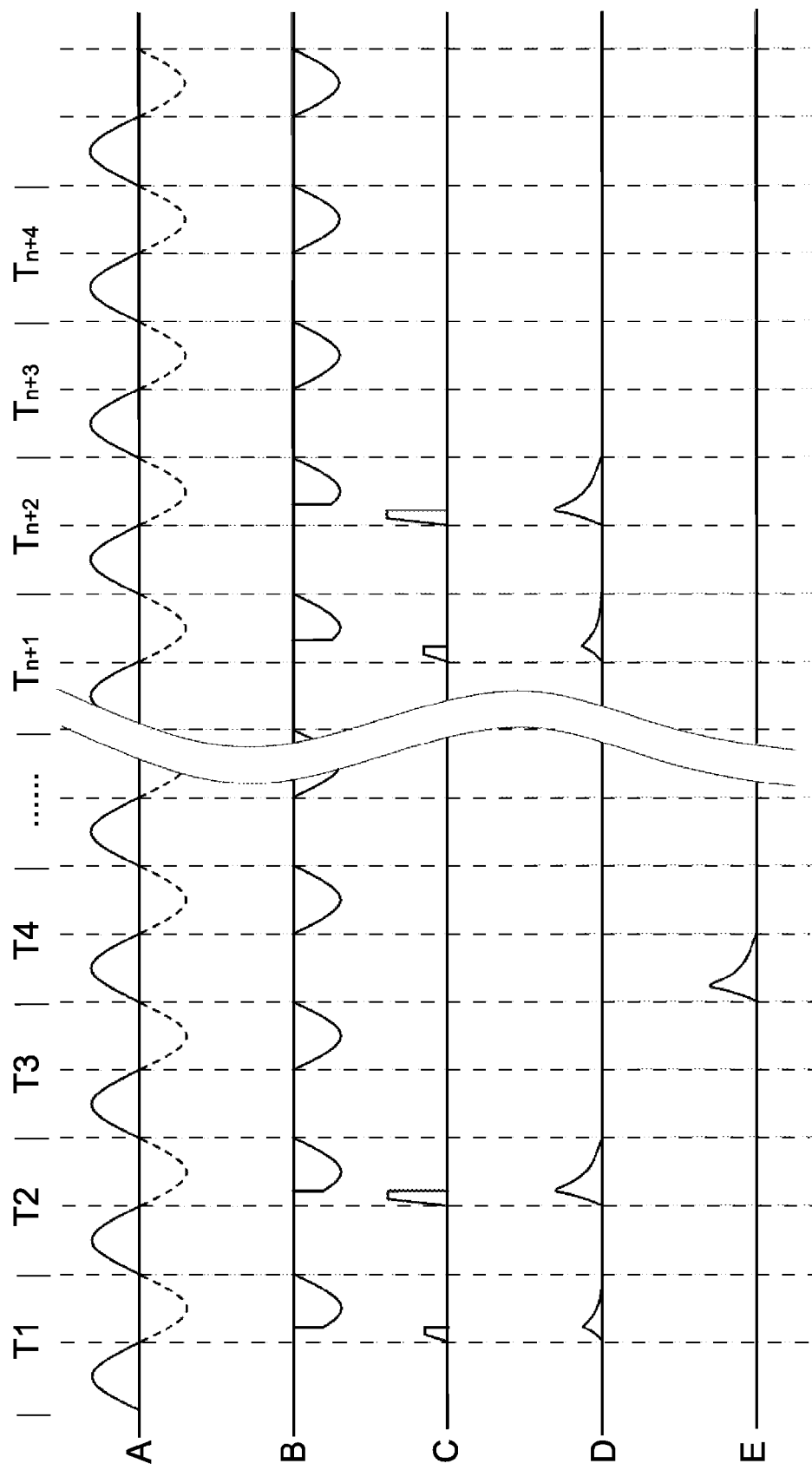

LEAKAGE CURRENT DETECTION DEVICE WITH SELF-TESTING FUNCTION

BACKGROUND OF THE INVENTION

Field of the Invention

This invention relates to the field of electrical appliance, and in particular, it relates to a leakage current detection device for use with electrical appliances.

Description of the Related Art

Electrical appliance are widely used, and their safety is an important issue. For safety, leakage current protection devices are installed in electrical outlets or at the input end of electrical appliances, and they are typically labeled to remind users to test the circuits before use to ensure that the leakage current protection device is functioning properly. However, during use, due to various reasons such as environmental factors and installation factors, the leakage current protection device may fail even if the user tests the device before use. This can cause serious danger and harm.

Therefore, protection device that can detect leakage current and have a self-testing function are highly desirable.

SUMMARY OF THE INVENTION

Accordingly, the present invention is directed to a leakage current detection device that has both a leakage current detection function and a self-testing function.

To achieve these and other advantages and in accordance with the purpose of the present invention, as embodied and broadly described, the present invention provides a leakage current detection device coupled to AC power supply wires carrying an AC signal, which includes: a leakage current detection circuit including a leakage current detector, the leakage current detection circuit operating during first half-cycles among positive and negative half-cycles of the AC signal to detect a leakage current of the power supply wires and to disconnect the power supply wires from an output side when a leakage current exceeding a first threshold value is detected; and a self-detecting circuit coupled to the leakage current detection circuit, operating during second half-cycles among the positive and negative half-cycles of the AC signal to test whether the leakage current detection circuit is functioning normally.

Preferably, the self-testing circuit includes a simulated leakage current generator circuit, for generating a first leakage current exceeding the first threshold value on at least one of the power supply wires.

Preferably, the self-testing circuit further includes: a comparator circuit coupled to the simulated leakage current generator circuit, for outputting a first drive signal to drive the simulated leakage current generator circuit to generate the first leakage current.

Preferably, the self-testing circuit further includes: a switching element; and a period-setting circuit including a first resistor and a first capacitor coupled in series, the period-setting circuit being coupled to the switching element and a first input terminal of the comparator circuit, wherein the switching element provides a discharge path for the first capacitor.

Preferably, the self-testing circuit further includes a reference voltage generator circuit; wherein the comparator circuit includes: a first input coupled between the first resistor and the first capacitor of the period-setting circuit for receiving a voltage signal on the first capacitor; and a second input coupled to the reference voltage generator circuit for receiving a reference voltage signal; and wherein the period-setting circuit and the reference voltage generator circuit receive a common voltage signal from one of the power supply wires.

Preferably, the leakage current detection circuit further includes: a processor unit coupled to the leakage current detector and the switching element for driving the switching element based on signals from the leakage current detector.

Preferably, an output of the comparator circuit is coupled to the switching element, wherein when the first input of the comparator has a higher voltage than the second input of the comparator, the comparator outputs a signal to trigger the switching element to become conductive.

Preferably, the leakage current detection device further includes a reset switch connected between the power supply wires and the power output end; wherein the leakage current detection circuit further includes a solenoid coupled to the switching element, wherein when the switching element becomes conductive during the first half-cycles, the solenoid operates to open the reset switch.

Preferably, the leakage current detection circuit further includes: a branch auxiliary switch coupled between the solenoid and the power supply wires, the branch auxiliary switch and the reset switch RESET being mechanically linked to open and close at the same time.

Preferably, the leakage current detection circuit further includes: a first fault indicator unit coupled to the solenoid for indicating whether the reset switch is closed.

Preferably, the self-testing circuit further includes: a second fault indicator unit coupled to an output of the comparator circuit, for emitting a fault indication signal when the comparator continues to output a high voltage signal.

Preferably, the leakage current detection device further includes: a neutral-leakage indicator circuit coupled between a ground wire and a neutral wire of the power supply wires, for emitting a signal based on the voltage variation on the neutral wire to indicate that the neutral wire is charged.

Preferably, the self-testing circuit further includes: a drive circuit having its first input coupled to an output of comparator circuit and its output coupled to a control electrode of the switching element, for driving the switching element based on the output signal of the comparator circuit.

Preferably, the switching element is a silicon controlled rectifier.

In another aspect, the present invention provides a power coupling device which employs a leakage current detection device described above.

By operating the leakage current detection circuit and the self-testing circuit respectively in the positive and negative half-cycles of the AC signal, the safety and reliability of the device is enhanced. The leakage current detection device according to embodiments of the present invention has the advantages of low cost, high reliability, and ease of manufacturing.

It is to be understood that both the foregoing general description and the following detailed description are exemplary and explanatory and are intended to provide further explanation of the invention as claimed.

BRIEF DESCRIPTION OF THE DRAWINGS

FIG. 4 show the waveforms at various points in the leakage current detection circuit according to embodiments of the present invention.

DETAILED DESCRIPTION OF THE PREFERRED EMBODIMENTS

Embodiments of the present invention are describe in detail below with reference to the drawings. It should be understood that the detailed descriptions do not limit the scope of the invention.

Figure 1:
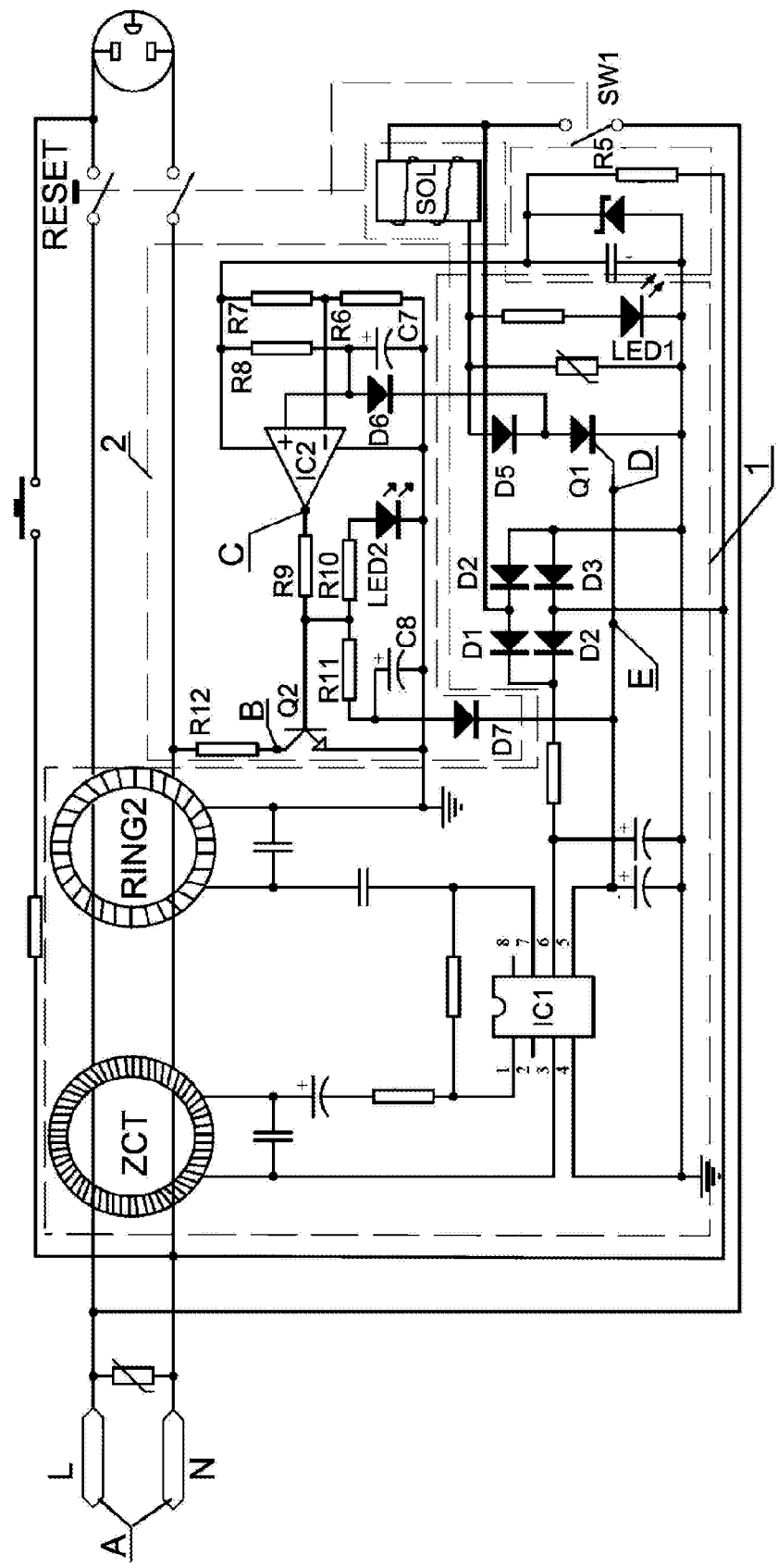
FIG. 1 is a circuit diagram of a leakage current detection device according to a first embodiment of the present invention.

FIG. 1 shows a circuit diagram of a first embodiment of the present invention. FIG. 4 illustrate the waveforms at various points of this circuit.

The leakage current detection device for electrical appliance includes: (1) Leakage current detection circuit 1 for detecting a leakage fault in the power supply wires. Leakage fault here refers to a leakage signal that exceeds a first threshold value. (2) Self-testing circuit 2, for testing whether the leakage current detection circuit 1 is functioning normally. These two circuits are arranged to respectively work in the positive and negative half-cycles of the AC supply current, i.e., the leakage current detection circuit operates in only one half-cycle of each cycle to detect leakage fault, and the self-testing circuit operates in only the other half-cycle of each cycle to test the proper function of the leakage current detection circuit.

The leakage current detection circuit 1 includes: a detection coil ZCT, a solenoid SOL, a silicon controlled rectifier Q1, a diode D5, and a processor unit IC1. The silicon controlled rectifier Q1 may be replaced by another switching element that has a switching function, such as a MOS transistor.

The self-testing circuit 2 includes a comparator circuit IC2 and a simulated leakage current generator circuit. The comparator circuit periodically generates a comparison result, which drives the simulated leakage current generator circuit to generate a leakage current. As a result, the simulated leakage current generator circuit generates a first leakage current that exceeds the first threshold value on at least one of the power supply wires. In the circuit shown in FIG. 1, the simulated leakage current generator circuit generates the first leakage current on the neutral wire N.

It can be seen that this leakage current is initiated by the simulated leakage current for simulating a leakage current which occurs when a leakage fault exists in the electrical system.

The two ends of the coil ZCT are coupled to pins 1 and 3 of the processor IC1. When the coil ZCT outputs a voltage variation that exceeds a threshold, pin 5 of the processor IC1 outputs a high voltage signal; otherwise it outputs a low voltage signal. A diode bridge rectifier D1-D4 is coupled to the hot wire L and neutral wire N of the power supply, and also coupled to pin 6 of the processor IC1 via resistor R3, in order to supply an operating voltage to the processor IC1 in both half-cycles. Pin 7 of the processor IC1 is coupled to another coil RING2, to take the variation of the induced voltage on the coil RING2.

A branch auxiliary switch SW1 is mechanically linked to the reset switch RESET to open and close at the same time.

Referring to FIG. 1 and FIG. 4, when the reset switch RESET is reset (i.e. closed), the power supply wires L and N have power, and the AC waveform at point A in FIG. 1 is a sine wave.

The operations of the leakage current detection circuit and self-testing circuit in their respective half-cycles are described below. In this example, the above two circuits operate in the positive and negative half-cycles, respectively.

Positive Half-Cycle: Leakage Current Detection

In the positive half-cycle, both the auxiliary switch SW1 and reset switch RESET are both closed, and the coil ZCT detects whether a leakage current exists on the hot or neutral wires L and N.

If no leakage current exists, pin 5 of the processor IC1 outputs a low voltage signal. As a result, the silicon controlled rectifier Q1 does not conduct and the current flow in the solenoid SOL does not change, so that the reset switch RESET will not be opened.

If a leakage current exists, an induced voltage is output by the coil ZCT to pins 1 and 3 of the processor IC1. As a result, pin 5 of the processor IC1 outputs a high voltage signal, triggering the silicon controlled rectifier Q1 to conduct. The waveform at the control electrode of the silicon controlled rectifier Q1 in this situation is shown as waveform E in FIG. 4. (Note that point E and point D in FIG. 1 are the same point but waveform E and waveform D described later are not the same because they occur at different times.) At this time, the current in the solenoid SOL will have a large change due to the silicon controlled rectifier Q1 becoming conductive, which opens the reset switch RESET. This also opens the auxiliary switch SW1 to cut off the current path between the hot and neutral wires L and N.

When the power supply circuit is supplying power, i.e., the solenoid did not have a large current variation due to the silicon controlled rectifier Q1 becoming conductive, a first fault indicator unit (which includes resistor R4 and light emitting diode LED1) coupled to the solenoid SOL will continue to emit light (an indicator signal) to inform the user that the reset switch RESET is closed. When the silicon controlled rectifier Q1 is conductive causing the reset switch RESET to open, the first fault indicator unit stops emitting light, informing the user that the power supply circuit is open. In addition, when the solenoid SOL is broken, i.e. the coil in the solenoid SOL is an open circuit, the first fault indicator unit also stops emitting light.

For the self-testing circuit 2, because the neutral wire N does not supply power to it in the positive half-cycle, the self-testing circuit 2 does not operate in this half-cycle. Only the leakage current detection circuit 1 operates in the positive half-cycle.

Negative Half-Cycle: Self-Testing

In the negative half-cycle, similar to the positive half-cycle, both the auxiliary switch SW1 and reset switch RESET are closed, and the coil ZCT detects whether a leakage current exists on the hot or neutral wires L and N.

The self-testing circuit 2 additionally includes a period-setting circuit comprised of a resistor R8 and a capacitor C7 coupled in series; the period-setting circuit is coupled to the silicon controlled rectifier Q1 and a first input terminal (positive) of the comparator IC2. When the silicon controlled rectifier Q1 is conductive, it provides a path to allow capacitor C7 to discharge, so as to lower the voltage across capacitor C7.

The positive input of the comparator IC2 is coupled between resistor R8 and capacitor C7, to receive the voltage signal on capacitor C7. The negative input of the comparator IC2 is coupled to a reference voltage generator circuit which comprises resistor R7 and resistor R6, to receive a reference voltage signal. Both the period-setting circuit (R8 and C7) and the reference voltage generator circuit (R7 and R6) are supplied by the voltage signal on the neutral wire N.

Situation 1: The Leakage Current Detection Circuit is Functioning Normally

Because resistor R8 and capacitor C7 on the positive input of the comparator IC2 are coupled to the neutral wire N via resistor R5, resistor R8 charges capacitor C7 during the negative half-cycle. When the voltage on capacitor C7 is higher than the voltage on resistor R6 (i.e. the negative input of comparator IC2), the output of the comparator IC2 will reverse, so the voltage at the output point C of comparator IC2 becomes a high voltage signal.

Point C is coupled to the base electrode of the transistor Q2 via resistor R9; thus, when point C outputs a high voltage signal, transistor Q2 becomes conductive which in turn pulls down the voltage at point B (collector of transistor Q2). The time duration that transistor Q2 remains conductive depends on the time duration when the high voltage signal at point C is maintained. The conduction of transistor Q2 introduces a current Ic of a predetermined value in the detection coil ZCT. This current Ic is set to be larger than or equal to a leakage current detection threshold value $I_f$, otherwise the processor IC1 will not recognize the output signal of the coil ZCT caused by the current Ic as a leakage current signal. Therefore, the transistor Q2 and resistor R12 introduce a leakage current to be detected by the coil ZCT, which flows from the emitter of transistor Q2 (grounded) via diode D2 of the rectifier bridge to the hot wire L to form a current loop.

In response to the leakage current Ic, based on the output signal from the coil ZCT, the processor IC1 outputs a high voltage signal at pin 5 to trigger the silicon controlled rectifier Q1 to conduct. Because the silicon controlled rectifier Q1 conducts, diode D6 also conducts. Because diode D6 is coupled to the positive end of capacitor C7 and the positive input of comparator IC2, capacitor C7 discharges via diode D6 and silicon controlled rectifier Q1, causing the voltage at the positive input of the comparator IC2 to drop rapidly; in turn, the output of the comparator IC2 reverses to a low voltage.

When the voltage at the positive input of comparator IC2 is lower than that at its negative input, the output of comparator IC2 at point C is a low voltage, so transistor Q2 is off. At this time, because the coil ZCT is not supplied with a current (i.e. the leakage current Ic is not generated), the coil ZCT does not detect a leakage current, so the voltage signal at pin 5 of the processor IC1 and the control electrode of silicon controlled rectifier Q1 (point D) is zero. Thus, when the leakage current detection circuit 1 functions normally during the negative half-cycle, the conducting state of silicon controlled rectifier Q1 depends on the voltage on capacitor C7. Because capacitor C7 is discharged, its voltage drops and cannot reach the threshold trigger voltage required to trigger silicon controlled rectifier Q1 and/or diode D6 to conduct; therefore, silicon controlled rectifier Q1 is off.

When the leakage current detection circuit 1 functions normally and the leakage current detection threshold value $I_f$ does not change, in the next cycle capacitor C7 starts to be charged again, and the above process repeats. The period of the detection can be adjusted by adjusting the parameters of capacitor C7 and resistor R8; the period of detection may be an integer multiple of the period of the AC current.

Situation 2: The Leakage Current Detection Circuit is Not Functioning Normally

When the leakage current detection circuit 1 has an abnormal condition or the leakage current detection threshold value $I_f$ increases, for example, if capacitor C2 is open or processor IC1 is abnormal causing the leakage current detection circuit 1 to lose its leakage current detection capability, or if the leakage current detection threshold value $I_f$ (which is a parameter of the circuit 1) increases so that the leakage current Ic generated by the self-testing circuit 2 is less than $I_f$, pin 5 of processor IC1 outputs a low voltage, so silicon controller rectifier Q1 does not conduct. As a result, capacitor C7 does not have a discharge path, so the voltage on capacitor C7 remains higher than the negative input of comparator IC2, and the output point C of the comparator IC2 continues to output a high voltage. Thus, transistor Q2 continues to conduct, and a second light emitting diode LED2 (second fault indicator) continues to emit light to indicate an abnormal condition to inform the user to stop using the device.

If at this time the silicon controlled rectifier Q1 and diodes D6 and D7 are all functioning normally, comparator IC2 will charge capacitor C8 via resistor R11. When the voltage on capacitor C8 reaches a predetermined value, diode D7 and silicon controlled rectifier Q1 become conductive. Because comparator IC2 continues to output a high voltage signal, the conducting of silicon controlled rectifier Q1 causes the current in the solenoid SOL to increase momentarily. This opens the reset switch RESET, disrupting the electrical connection between the input and output sides, so that the user cannot use the device.

In FIG. 4, during the period T1, because the charging of capacitor C7 by the neutral wire N is relatively slow, the output waveform at point C does not fully reaches the high voltage level; when the voltage on capacitor C7 exceeds the voltage on resistor R6, the output voltage at point C start to reverse, which turns on silicon controlled rectifier Q1. Correspondingly, silicon controlled rectifier Q1 is not fully turned on, as shown by waveform D, so that the charges on capacitor C7 cannot be fully discharged. In the next period T2, because capacitor C7 still has some charges accumulated in period T1, the neutral wire N continues to charge capacitor C7 and raises the voltage on capacitor C7 to a higher level. As a result, the output voltage at point C is fully reversed to reach the high voltage level; in turn, this high voltage signal triggers silicon controlled rectifier Q1 to fully turn on so as to fully discharge the charge on capacitor C7. Correspondingly, at point B, during the positive half-cycle no wave is generated, and during the negative half-cycle, because when point C is at a high voltage level it can pull down the voltage level at point B, the voltage at point B is still a low voltage at the beginning of the negative half-cycle; and then when point C reverses to a low voltage, the wave at point B becomes the same as the waveform at point A. It is noted that in the waveform B, the missing portion in period T2 is slightly larger than the missing portion in period T1.

By setting the values of resistor R8 and capacitor C7, the period of self-testing can be adjusted. During periods T3 and T4, because capacitor C7 is fully discharged during period T2, in these two periods, the voltage on capacitor C7 is insufficient to cause the output of the comparator IC2 to reverse. When the voltage at point C is not reversed, silicon controlled rectifier Q1 does not conduct, so the neutral wire N continues to charge capacitor C7, until period $T_{n=1}$. Similar to period T1, during period $T_{n+1}$, the voltage on capacitor C7 becomes sufficient to cause the output of comparator IC2 to reverse. Similar to period T2, during period $T_{n+2}$, capacitor C7 is fully discharged, and the voltage at point C becomes the low voltage again.

It should be understood that, the positive vs. negative half-cycle in the above descriptions are not limiting; by adjusting the circuits appropriately, the operations of the various circuits in the positive and negative half-cycles can be swapped, i.e. the operations in the positive half-cycle described above can occur in the negative half-cycle and vise versa.

Figure 2:
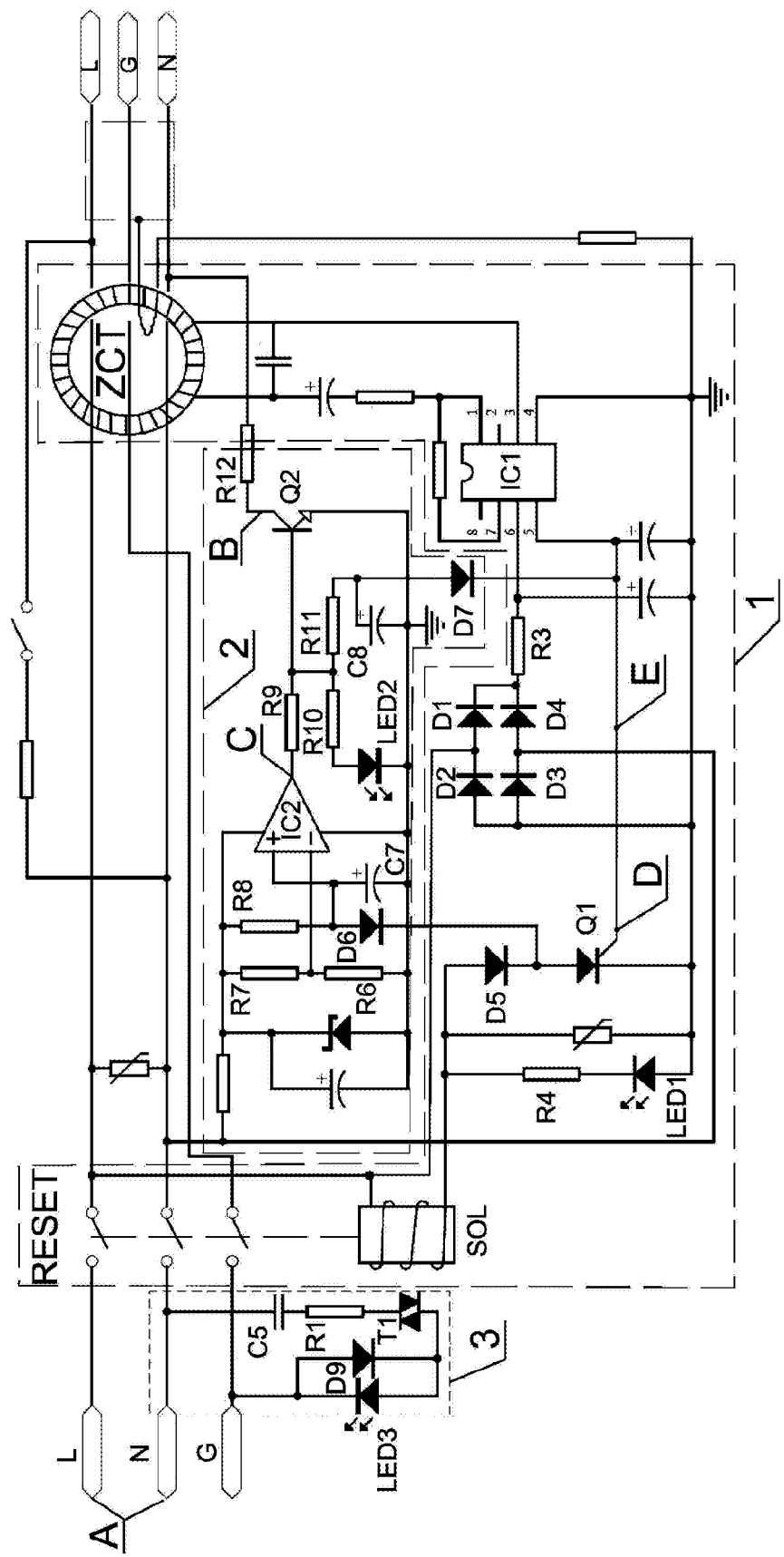
FIG. 2 is a circuit diagram of a leakage current detection device according to a second embodiment of the present invention.

FIG. 2 shows a circuit diagram of a second embodiment of the present invention.

Compared to the first embodiment, the second embodiment omits the auxiliary switch SW1, and the leakage current detection circuit 1 and self-testing circuit 2 are both coupled to the power supply lines after the reset switch RESET, so this circuit is more suitable for use in an electrical appliance.

Similar to the first embodiment, when the reset switch RESET is closed, the neutral wire N charges capacitor C7 during the negative half-cycle, which in turn controls the output state of the comparator IC2 at point C. The processor IC1 still controls the conductive state of the silicon controlled rectifier Q1 via pin 5. When the silicon controlled rectifier Q1 conducts, the solenoid SOL has a large current flowing through it, causing it to open the reset switch RESET, disconnecting the power supply from the downstream circuits.

The circuit of this embodiment also includes a neutral-leakage indicator circuit 3, which is coupled between the ground wire G and the neutral wire N. The neutral-leakage indicator circuit 3 includes capacitor C5, resistor R1, symmetrical trigger diode T1, light emitting diode LED3 and diode D9. Based on the voltage variation on the neutral wire N, the neutral-leakage indicator circuit 3 emits a signal to indicate that the neutral wire is charged.

Figure 3:
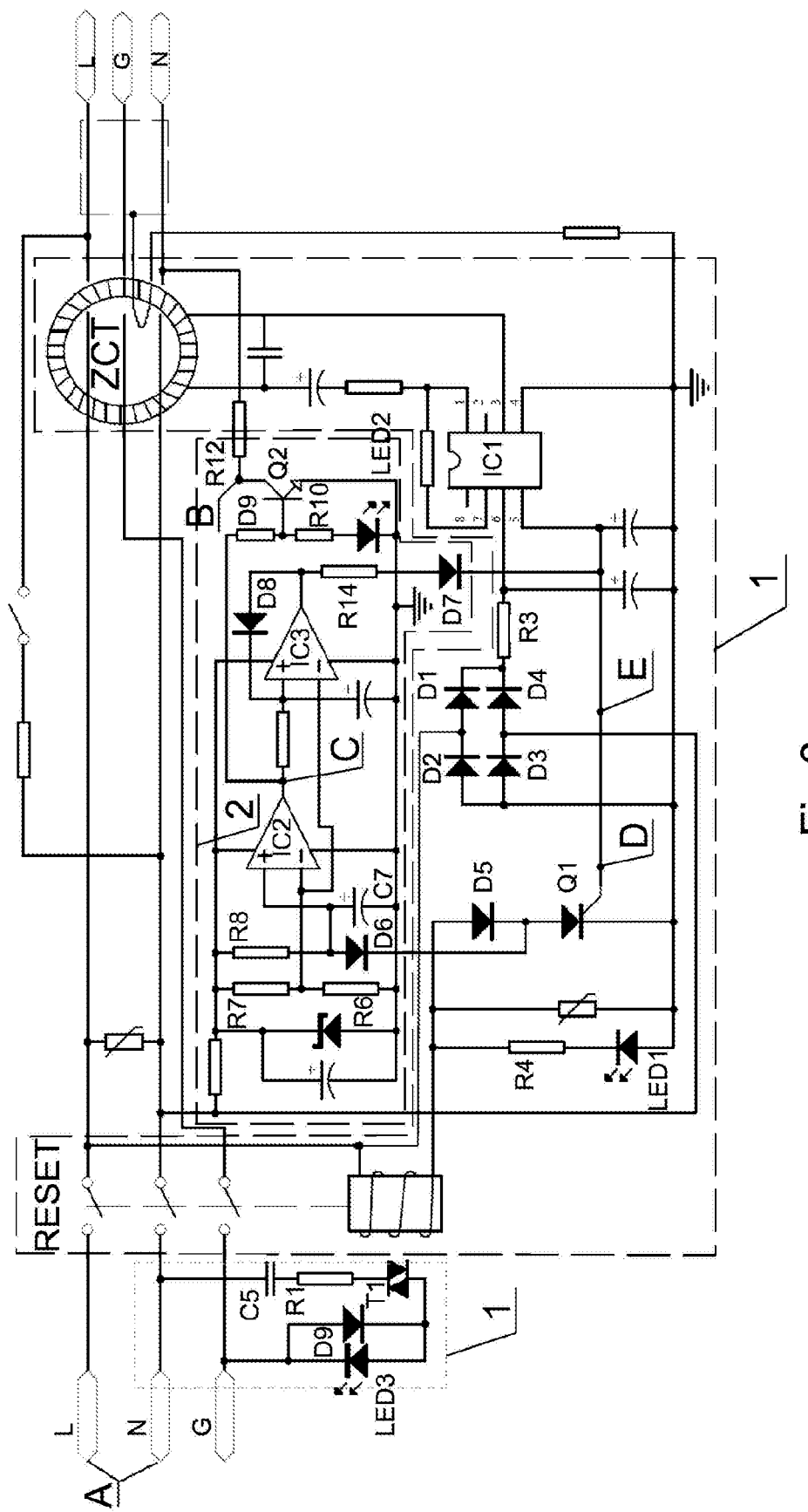
FIG. 3 is a circuit diagram of a leakage current detection device according to a third embodiment of the present invention.

FIG. 3 shows a circuit diagram of a third embodiment of the present invention.

Compared to the second embodiment, in the third embodiment, a drive unit IC3 is coupled to the output of comparator IC2, to drive the silicon controlled rectifier Q1 based on the output of the comparator IC2.

The drive unit IC3 includes an amplifier with a positive feedback coupling. The output of the drive unit IC3 is coupled to its positive input via diode D8, and also coupled to the control electrode of silicon controlled rectifier Q1 via diode D7. The negative inputs of drive unit IC3 and comparator IC2 use a common input. Thus, when the output of comparator IC2 reverses, the output of the drive unit IC3 reverses in synchrony. Because the drive unit IC3 and diode D8 form a positive feedback, the reversion of the drive unit IC3 is faster, and the drive capability is enhanced, so the silicon controlled rectifier Q1 can be fully turned on.

Embodiments of the present invention uses the positive and negative half-cycles to respectively operate the leakage current detection circuit and the self-testing circuit, which improves the safety of the overall circuit.

It will be apparent to those skilled in the art that various modification and variations can be made in the leakage current detection circuit of the present invention without departing from the spirit or scope of the invention. Thus, it is intended that the present invention cover modifications and variations that come within the scope of the appended claims and their equivalents.

What is claimed is:

1. A leakage current detection device coupled to AC power supply wires carrying an AC signal, comprising:
   a leakage current detection circuit including a leakage current detector, the leakage current detection circuit operating during first half-cycles among positive and negative half-cycles of the AC signal to detect a leakage current of the power supply wires and to disconnect the power supply wires from an output side when a leakage current exceeding a first threshold value is detected; and
   a self-detecting circuit coupled to the leakage current detection circuit, operating during second half-cycles among the positive and negative half-cycles of the AC signal to test whether the leakage current detection circuit is functioning normally,
   wherein the self-testing circuit includes: a simulated leakage current generator circuit, for generating a first leakage current exceeding the first threshold value on at least one of the power supply wires, and a comparator circuit coupled to the simulated leakage current generator circuit, for outputting a first drive signal to drive the simulated leakage current generator circuit to generate the first leakage current.

2. The leakage current detection device of claim 1, wherein the self-testing circuit further includes:
   a switching element; and
   a period-setting circuit including a first resistor and a first capacitor coupled in series, the period-setting circuit being coupled to the switching element and a first input terminal of the comparator circuit, wherein the switching element provides a discharge path for the first capacitor.

3. The leakage current detection device of claim 2,
   wherein the self-testing circuit further includes a reference voltage generator circuit;
   wherein the comparator circuit includes:
   a first input coupled between the first resistor and the first capacitor of the period-setting circuit for receiving a voltage signal on the first capacitor; and
   a second input coupled to the reference voltage generator circuit for receiving a reference voltage signal; and
   wherein the period-setting circuit and the reference voltage generator circuit receive a common voltage signal from one of the power supply wires.

4. The leakage current detection device of claim 2, wherein the leakage current detection circuit further includes:
   a processor unit coupled to the leakage current detector and the switching element for driving the switching element based on signals from the leakage current detector.

5. The leakage current detection device of claim 3, wherein an output of the comparator circuit is coupled to the switching element, wherein when the first input of the comparator has a higher voltage than the second input of the comparator, the comparator outputs a signal to trigger the switching element to become conductive.

6. The leakage current detection device of claim 2, further comprising a power output end and a reset switch connected between the power supply wires and the power output end;
   wherein the leakage current detection circuit further includes a solenoid coupled to the switching element, wherein when the switching element becomes conductive during the first half-cycles, the solenoid operates to open the reset switch.

7. The leakage current detection device of claim 6, wherein the leakage current detection circuit further includes:
   a branch auxiliary switch coupled between the solenoid and the power supply wires, the branch auxiliary switch and the reset switch RESET being mechanically linked to open and close at the same time.

8. The leakage current detection device of claim 6, wherein the leakage current detection circuit further includes:
   a first fault indicator unit coupled to the solenoid for indicating whether the reset switch is closed.

9. The leakage current detection device of claim 1, wherein the self-testing circuit further includes:
   a second fault indicator unit coupled to an output of the comparator circuit, for emitting a fault indication signal when the comparator continues to output a high voltage signal.

10. The leakage current detection device of claim 2, further comprising:
    a neutral-leakage indicator circuit coupled between a ground wire and a neutral wire of the power supply wires, for emitting a signal based on the voltage variation on the neutral wire to indicate that the neutral wire is charged.

11. The leakage current detection device of claim 2, wherein the self-testing circuit further includes:
    a drive circuit having its first input coupled to an output of comparator circuit and its output coupled to a control electrode of the switching element, for driving the switching element based on the output signal of the comparator circuit.

12. The leakage current detection device of claim 2, wherein the switching element is a silicon controlled rectifier.

* * * * *